(12) United States Patent
Farides

(10) Patent No.: US 8,248,115 B2
(45) Date of Patent: Aug. 21, 2012

(54) VOLTAGE CONTROLLED CURRENT DRIVER POWERED BY NEGATIVE VOLTAGE RAIL

(75) Inventor: Matthew E. Farides, Windsor, CT (US)

(73) Assignee: Hamilton Sundstrand Corporation, Windsor Locks, CT (US)

( * ) Notice: Subject to any disclaimer, the term of this patent is extended or adjusted under 35 U.S.C. 154(b) by 0 days.

(21) Appl. No.: 12/629,346

(22) Filed: Dec. 2, 2009

(65) Prior Publication Data
US 2011/0128048 A1 Jun. 2, 2011

(51) Int. Cl.
*H03B 1/00* (2006.01)
*H03K 3/00* (2006.01)
(52) U.S. Cl. .......................... 327/108; 326/83
(58) Field of Classification Search .......... 327/108; 326/83
See application file for complete search history.

(56) References Cited

U.S. PATENT DOCUMENTS

| | | | |
|---|---|---|---|
| 4,462,002 A * | 7/1984 | Schade, Jr. | 330/253 |
| 4,698,527 A | 10/1987 | Matsumoto | |
| 4,849,651 A | 7/1989 | Estes, Jr. | |
| 5,675,239 A | 10/1997 | Kim et al. | |
| 5,867,048 A * | 2/1999 | Chou | 327/172 |
| 6,788,116 B1 * | 9/2004 | Cook et al. | 327/108 |
| 2008/0315813 A1 | 12/2008 | Yamada et al. | |

FOREIGN PATENT DOCUMENTS
JP 2004066840 A 3/2004

OTHER PUBLICATIONS

Extended European Search Report in foreign counterpart Application No. 10252030.1 dated Jun. 1, 2011, filed Nov. 30, 2010.

* cited by examiner

*Primary Examiner* — John Poos
(74) *Attorney, Agent, or Firm* — Kinney & Lange, P.A.

(57) ABSTRACT

A method and current drive circuit is provided that accepts a positive voltage input signal and supplies power to a load from a negative voltage rail.

18 Claims, 4 Drawing Sheets

VOLTAGE CONTROLLED CURRENT DRIVER POWERED BY NEGATIVE VOLTAGE RAIL

BACKGROUND

A torque motor is an inductive device that is controlled with a current based driver circuit. Torque motors can be used in any number of applications using pneumatic devices that need controllable flow. Examples of devices which employ torque motors are bleed systems, anti-icing systems, engine control systems, environmental control systems, and air management systems. The torque motor responds to the difference in pressure between the supply and demand sides to provide a regulated air flow. It provides more flow when more current is supplied to it. In this way, the flow is related to the current and can be regulated by using a driver with an adjustable current output.

Torque motor drivers are generally one of two types: linear voltage controlled current drivers and pulse width modulation (PWM) drivers. PWM drivers can use both a positive and negative voltage rail, but they have greater electromagnetic noise interference problems, require more sophisticated control techniques, and use more parts and layout space. Linear voltage controlled devices are simpler to implement and have better noise characteristics, which make them a preferred method in many implementations of a torque motor driver. A 50 mA current driver may supply 0 mA to the load at a command in put voltage of 0V, 25 mA at 2.5 V, and 50 mA at 5V, etc.

Known linear voltage controlled current drivers are driven by a positive voltage signal and powered by a positive voltage rail. Typical values are 0-5V input signals and 15-19 volt rails.

SUMMARY

A current drive circuit has an input terminal that receives a positive voltage control signal. A power input connects to a negative voltage power supply. Circuitry is configured to supply a controller current to an attached load from the negative voltage power supply. The magnitude of the controlled current is based on the positive voltage control signal.

Another embodiment of the invention is a method for supplying current to a load. A positive voltage input signal is received from a controller. Current is supplied to the load from a negative voltage power supply. The magnitude of the current is based on the magnitude of the positive voltage input signal.

An alternate embodiment of the present invention is a system for supplying power to loads. A negative supply current drive circuit is configured to supply current to an inductive load from a negative voltage power supply. The magnitude of the current is selected based on the magnitude of a positive voltage input signal.

DETAILED DESCRIPTION

Driving a load from the negative rail offers the advantage of balancing the power drawn from the positive and negative rails. Known methods of shifting the load to the negative voltage rail require changing the reference of the whole circuit lower towards the negative voltage rail. The problem, however, is that the voltage input signal would have to shift as well. This would require an alteration of the control circuitry or the addition of a level shifter to accommodate the change. An advantage of the present invention is that there is no need to change the control circuitry providing the voltage input signal. It can remain a positive 0-5V signal and the load is appropriately supplied from the negative voltage rail instead of the positive voltage rail. Other methods of driving a load from the negative voltage rail do not have this advantage.

Figure 1:
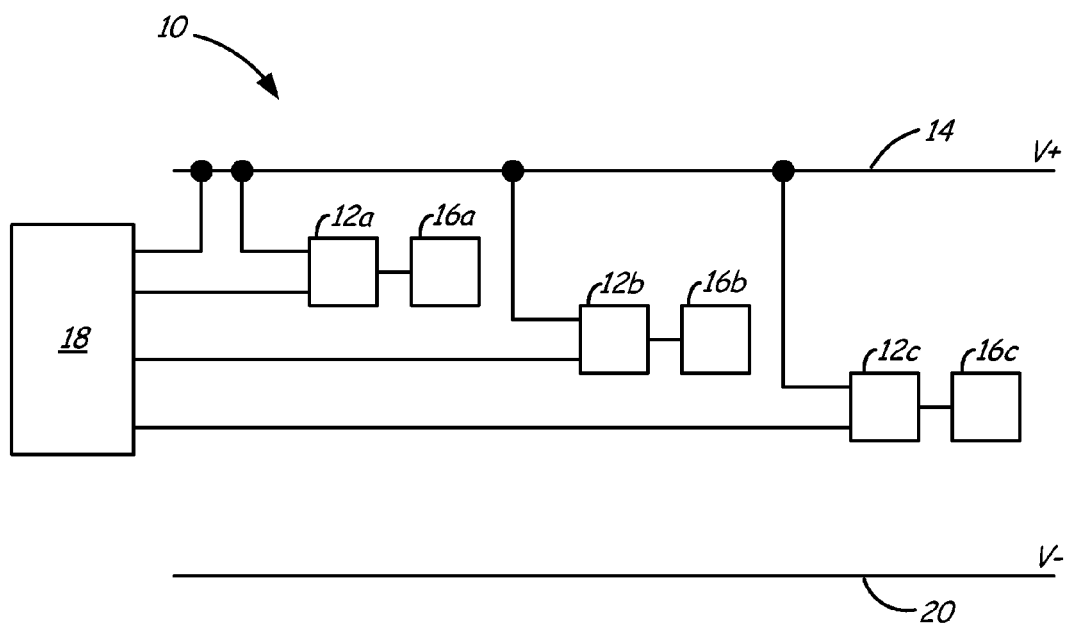
FIG. 1A is a system diagram illustrating current drivers and loads powered by a positive voltage rail as known in the prior art.
FIG. 1B is a circuit diagram illustrating a current driver powered by a positive voltage rail as known in the prior art.

FIG. 1A is a system diagram illustrating current drivers and loads powered by a positive voltage rail. System 10 includes current drivers 12a-12c powered from positive voltage rail 14. Loads 16a-16c are powered by current drivers 12a-12c respectively. Controller 18 is powered by positive voltage rail 14 and supplies positive voltage signals to current drivers 12a-12c. The positive voltage signals control the magnitude of the current supplied to loads 16a-16c by current drivers 12a-12c. Negative voltage rail 20 is available but unused by current drivers 12a-12c. This causes an imbalance between the power supplied by positive voltage rail 14 and negative voltage rail 20.

Figure 1B:
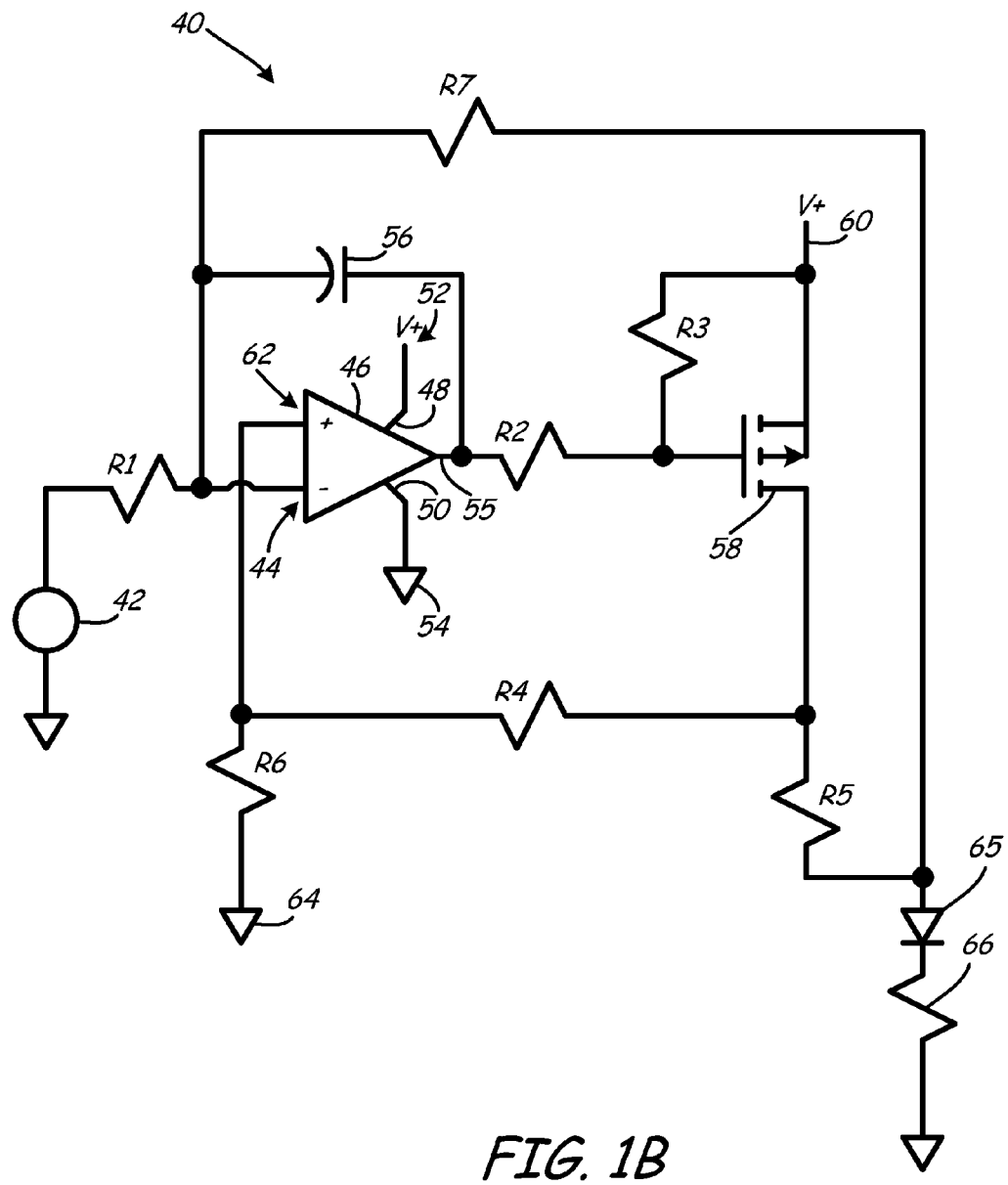

FIG. 1B is an exemplary circuit that may be employed by current drivers 12a-12c (from FIG. 1A) to power a load from a positive voltage rail. Circuit 40 has voltage input signal 42 connected to resistor R1. Resistor R1 is connected to inverting input 44 of operational amplifier (op amp) 46. Op amp 46 is powered by positive supply 48 and negative supply 50. In this example, positive supply 48 is connected to positive voltage rail contact 22 and negative supply 50 is connected to ground contact 54. Output 55 is connected to negative feedback capacitor 56. Negative feedback capacitor 56 is connected back to inverting input 44 and provides transient suppression. Output 56 is also connected to resistor R2. Resistor R2 is connected to the gate of p-channel field effect transistor (FET) 58 and resistor R3 which is connected to the source of p-channel FET 58 and positive voltage rail contact 60. The drain of p-channel FET 28 is connected to resistors R4 and R5. Resistor R4 is connected to non-inverting input 62 of op amp 46 and resistor R6 which is connected to ground contact 64. Resistor R5 is connected to diode 65 and resistor R7 which is connected to inverting input 44 op amp 46. Load 66 is connected to diode 65. Load 66 is the torque motor or other current based load. Diode 65 is provided only for protection and is not required.

Resistors R2 and R3 are used to properly bias p-channel FET 58. A typical value for both resistors is 4.99 k ohms. Resistor pairs R1/R7 and R6/R4 are used as voltage dividers and serve to configure op amp 16 as a feedback amplifier. Typical values are 200 k ohms for R1 and R6 and 20 k ohms for R7 and R4 to provide a gain of 0.1 from input voltage signal 42 to the voltage drop on resistor R5. Resistor R5 is used to adjust the gain of the current driver. A typical value is 10 ohms providing a 50 mA output for a 5V input signal. With this configuration, circuit 40 is a linear voltage controlled current driver driven off the positive voltage rail controlled by a positive input voltage.

Some torque motor applications have a positive and negative voltage rail available. When there are multiple torque motors which in turn require multiple drivers, the loading in the positive and negative voltage rails becomes imbalanced due to the current drivers all drawing from the positive voltage rail. The present invention addresses this by providing a current driver powered by the negative voltage rail. By powering some torque motors from the positive voltage rail and some from the negative voltage rail, the loads can be balanced between the two rails. Current drivers such as the one shown in FIG. 1B can not be operated at a negative voltage and are therefore incapable of operating off the negative voltage rail.

Figure 2A:
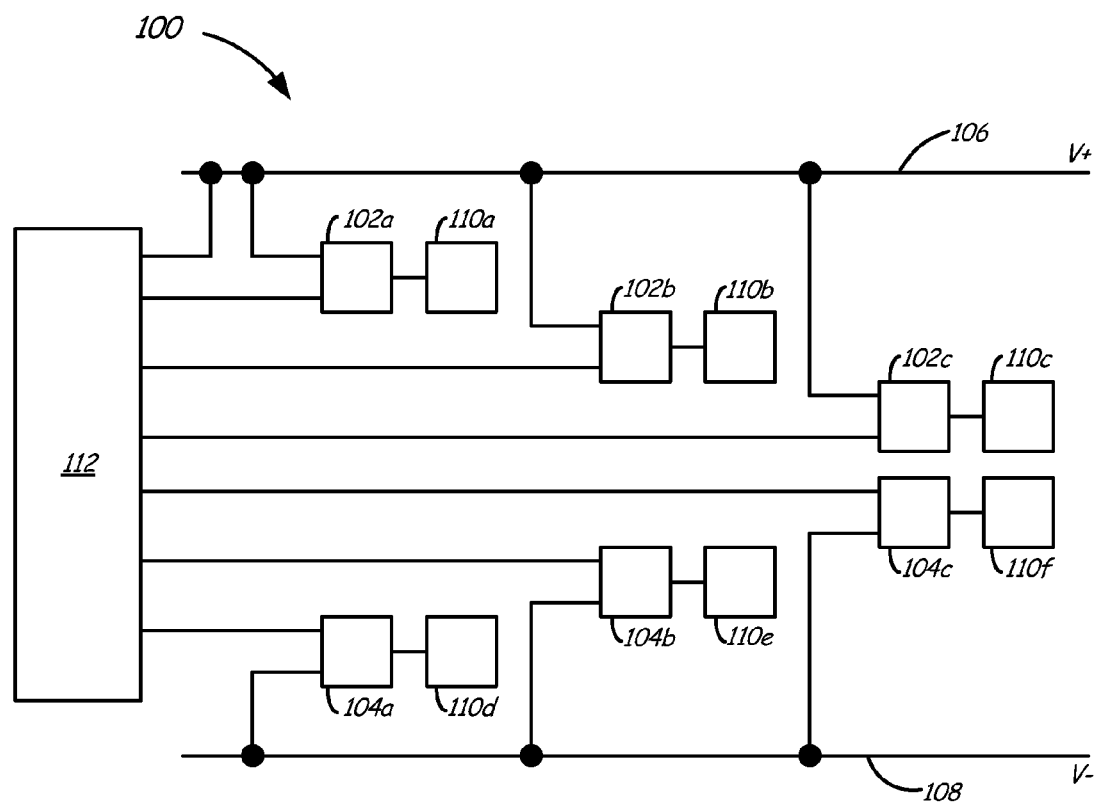
FIG. 2A is a system diagram illustrating current drivers and loads powered by a positive and negative voltage rail according to an embodiment of the present invention.

FIG. 2A is a system diagram of an embodiment of the present invention illustrating current drivers and loads powered by a positive and negative voltage rail. System 100 includes current drivers 102a-102c and 104a-104c. Current drivers 102a-102c are powered from positive voltage rail 106 and current drivers 104a-104c are powered from negative voltage rail 108. Loads 110a-f are powered by current drivers 102a-102c and 104a-104c. In one embodiment, loads 110a-f are inductive loads. Controller 112 is powered by positive voltage rail 106 and supplies positive voltage signals to current drivers 102a-102c and 104a-104c. Current drivers 104a-104c accept the same positive voltage signal as current drivers 102a-102c. From the perspective of controller 112 or loads 110a-110f, current drivers 104a-104c are identical to current drivers 102a-102c. They are interchangeable and allow the system designer to shift loads from positive voltage rail 106 to negative voltage rail 108 to balance the power being drawn from the two rails.

Figure 2B:
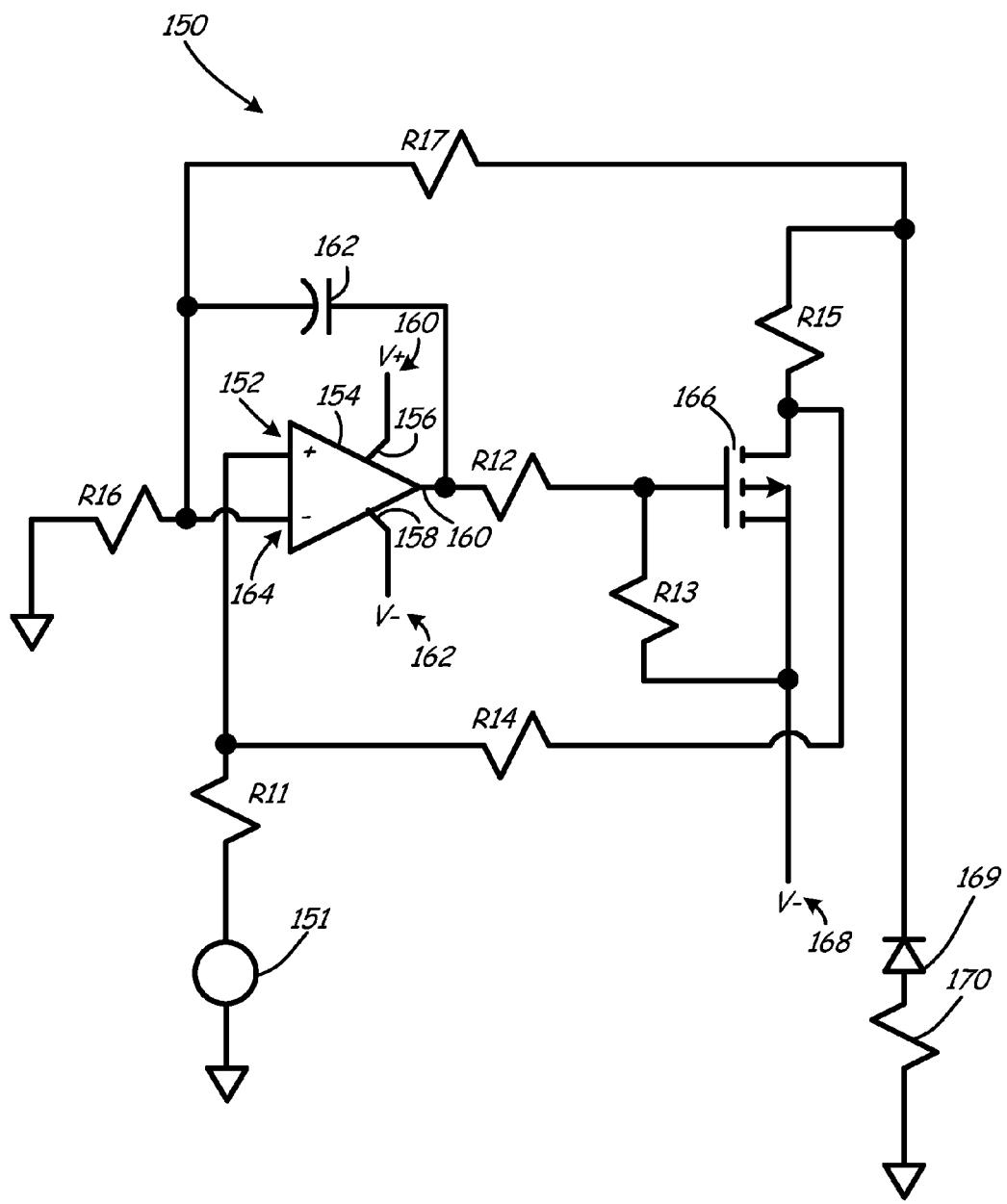
FIG. 2B is a circuit diagram illustrating a current driver powered by a negative voltage rail according to an embodiment of the present invention.

FIG. 2B is an illustration of an embodiment of the present invention for a current driver driven from the negative voltage rail. Circuit 150 has voltage input signal 151 connected to resistor R11. Resistor R11 is connected to non-inverting input 152 of op amp 154. Op amp 154 is powered by positive supply 156 and negative supply 158. In this example, positive supply 156 is connected to positive voltage rail contact 160 and negative supply 158 is connected to negative voltage rail contact 162. Alternatively, positive supply 156 can be connected to a ground contact. Output 160 is connected to negative feedback capacitor 162 which is connected to inverting input 164 of op amp 154. Negative feedback capacitor 162 serves the same transient suppression purpose as negative feedback capacitor 56 in FIG. 1B. Output 160 is also connected to resistor R12. Resistor R12 is connected to the gate of n-channel FET 166 and resistor R13 which is connected to the source of n-channel FET 166 and negative voltage rail contact 168. The drain of n-channel FET 166 is connected to resistors R14 and R15. Resistor R14 is connected to non-inverting input 152 of op amp 154. Resistor R15 is connected to diode 169 and resistor R17 which is connected to inverting input 164 of op amp 154. Load 170 is connected to diode 169. Diode 169 is provided only for protection and is not required.

Resistors R2 and R3 are used to properly bias n-channel FET 66 and can be 4.99 k ohms each. Resistor pairs R11/R17 and R16/R14 are used to configure op amp 154 as a feedback amplifier and can have values of 200 k ohms for R16 and R16 and 20k ohms for R17 and R14 to provide a gain of 0.1 from input voltage signal 151 to the voltage across resistor R15. Resistor R15 is the sense resistor placed in the current path of load 170. The voltage drop on R15 in the feedback loop for op amp 154 can be used to adjust the gain of the drive circuit by changing the resistance value of the resistor. A nominal value for R15 is 10 ohms. This allows a 0-5V input signal to provide a 0-50 mA current to load 160. The feedback amplifier is used to control the gate voltage of n-channel FET 166 to close the control loop and achieve the desired current through load 170.

When using the exemplary values given for resistors R11-R17 and a −15V negative voltage rail voltage, the output of amplifier 154 is near −15V when positive input voltage 151 is at 0V. This causes n-channel FET 166 to remain off. As positive input voltage 151 increases, the output of amplifier 154 will also increase turning on n-channel FET 166 and increasing the voltage drop on R15. At a 5V positive input voltage, amplifier 154 will increase the gate voltage of n-channel FET until it is supplying 50 mA of current to load 170. The 50 mA current creates a 500 mV drop on resistor R15. Because of the 0.1 gain setup by resistors R11, R14, R16, and R17, this balances the feedback circuit.

The positive voltage input is connected to the non-inverting input of the op-amp which has power supplies that accommodate a negative voltage. The second amplifier (the FET) is an n-type. This makes it possible to supply a controllable current from a negative voltage rail using the same positive input voltage to control the current. Using this architecture, a system with available positive and negative voltage rails (ex +15V and −15V) can be balanced by driving some of the loads from the negative voltage rail. Control of the circuit remains identical, which reduces the impact of changing the drive circuit to the remainder of the system which allows retrofitting.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A current drive circuit comprising:
an input terminal for receiving a positive voltage control signal;
a power input for connection to a negative voltage power supply; and
circuitry configured to supply a controlled current to an attached load from the negative voltage power supply, a magnitude of the controlled current based on the positive voltage control signal, wherein the circuitry includes a feedback amplifier having an output and configured to accept the positive voltage control signal and a second amplifier connected to the output of the feedback amplifier and configured to supply the controlled current to the attached load from the negative voltage power supply.

2. The current drive circuit of claim 1 wherein the feedback amplifier comprises an operational amplifier.

3. The current drive circuit of claim 1 wherein the second amplifier is an n-channel field effect transistor.

4. The current drive circuit of claim 1 wherein the positive voltage control signal is in the range of 0-5 V.

5. A current drive circuit comprising:
an input terminal for receiving a positive voltage control signal;
a power input for connection to a negative voltage power supply; and
circuitry configured to supply a controlled current to an attached load from the negative voltage power supply, a magnitude of the controlled current based on the positive voltage control signal, the circuitry further comprising:
a ground reference;

a first amplifier having an output, an inverting input and a non-inverting input;

a second amplifier having an input connected to the output of the first amplifier and an output adapted to supply the controlled current;

a current sense resistor connected between the output of the second amplifier and the attached load;

a first resistor connected between the non-inverting input of the first amplifier and the input terminal;

a second resistor connected between the non-inverting input of the first amplifier and the output of the second amplifier;

a third resistor connected between the inverting input of the first amplifier and the ground reference; and a fourth resistor connected between the inverting input of the first amplifier and the attached load.

6. The current drive circuit of claim 5 further comprising a capacitor connected to the inverting input of the amplifier and the output of the amplifier.

7. The current drive circuit of claim 5 wherein the positive voltage control signal is in the range of 0-5 V.

8. The current drive circuit of claim 5 wherein the first amplifier is an operational amplifier having a positive power supply terminal and a negative power supply terminal, where the positive supply terminal is connected to a positive voltage power supply and the negative supply terminal is connected to a negative voltage power supply.

9. The current drive circuit of claim 5 wherein the first amplifier is an operational amplifier having a positive power supply terminal and a negative power supply terminal where the positive supply terminal is connected to a ground contact and the negative supply terminal is connected to a negative voltage power supply.

10. The current drive circuit of claim 5 wherein the second amplifier is an n-channel field effect transistor.

11. The current drive circuit of claim 10 further comprising:

a gate terminal, source terminal, and drain terminal on the n-channel field effect transistor;

a first biasing resistor connected between the output of the first amplifier and the gate terminal of the n-channel field effect transistor; and a second biasing resistor connected between the gate terminal and the source terminal of the n-channel field effect transistor;

wherein the current sense resistor is connected between the drain terminal of the n-channel field effect transistor and the attached load.

12. A method for supplying current to a load comprising:
receiving a positive voltage input signal from a controller;
supplying current to the load from a negative voltage power supply where a magnitude of the current is based on a magnitude of the positive voltage input signal, wherein supplying current to the load includes:

comparing a voltage drop on a current sense resistor to the positive voltage input signal using a feedback amplifier;

supplying a control signal to a second amplifier from an output of the feedback amplifier; and supplying current to the load from the second amplifier based on a magnitude of the control signal.

13. The method of claim 12 wherein providing the positive input voltage signal comprises providing a 0-5V input voltage signal.

14. The method of claim 12 wherein supplying current to the load comprises supplying a current in the range of approximately 0-50 mA.

15. The method of claim 12 wherein the second amplifier is an n-channel FET.

16. A system for supplying power to inductive loads comprising:

at least one inductive load;

at least one negative supply current driver circuit configured to supply current to the inductive load from a negative voltage power supply where a magnitude of the current is selected based on a magnitude of a positive voltage input signal.

17. The system of claim 16 further comprising:

at least a second inductive load;

at least one positive supply current driver circuit configured to supply current to the second inductive load from a positive voltage power supply where a magnitude of the current is selected based on a magnitude of a positive voltage input signal.

18. The system of claim 17 further comprising:

a plurality of loads;

a plurality of negative supply current drive circuits; and a plurality of positive supply current drive circuits;

wherein each of the negative supply current drive circuits and the positive supply current drive circuits is connected to at least one of the plurality of loads such that a total power drawn from the positive voltage power supply is approximately equal to a total power drawn from the negative voltage power supply.

* * * * *